United States Patent

Wakefield

[15] 3,673,063

[45] June 27, 1972

[54] PRODUCTION OF LEAD-TIN-TELLURIDE MATERIAL FOR INFRARED DETECTORS

[72] Inventor: Shirley L. Wakefield, Cincinnati, Ohio

[73] Assignee: Avco Corporation, Cincinnati, Ohio

[22] Filed: March 31, 1971

[21] Appl. No.: 129,995

[52] U.S. Cl. ........................204/140.5, 148/133, 204/141, 204/143 GE

[51] Int. Cl. ....................C23b 3/06, C23b 1/00, B23p 1/00

[58] Field of Search ............204/140.5, 141, 143 R, 143 GE; 148/133

[56] References Cited

UNITED STATES PATENTS

| | | | |
|---|---|---|---|
| 3,102,090 | 8/1963 | Bassi | 204/140.5 |
| 3,485,731 | 12/1969 | Yokozawa | 204/141 |
| 3,527,682 | 9/1970 | Valvo | 204/141 |

OTHER PUBLICATIONS

P. H. Schmidt, Electrolytic Polish For Lead Telluride, Journal of the Electrochemical Society, Vol. 108, No. 1, Jan. 1961, pg. 104, 105

Marriner Norr, An Electrolyte Polish and Etch For Lead Telluride, Jour. Of the Electrochemical Society, Vol. 109, May 1962, pg. 433, 434

*Primary Examiner*—John H. Mack
*Assistant Examiner*—T. Tufariello
*Attorney*—Charles M. Hogan

[57] ABSTRACT

The invention is a method of producing lead-tin-telluride material for use in making diffused junction photodiodes. Detector diodes which are made from such material can be produced directly from a wafer without the necessity of using conventional time-consuming back-etching. The steps of my method comprise slicing thin wafers from a pre-alloyed boule, mechanically polishing the sliced wafers to remove major imperfections in the flat surfaces, electropolishing said wafers to produce undamaged clean surfaces and finally annealing the sliced and polished wafers to reduce Hall carrier concentration.

6 Claims, No Drawings

PRODUCTION OF LEAD-TIN-TELLURIDE MATERIAL FOR INFRARED DETECTORS

BACKGROUND

The production of shallow lead-tin-telluride junctions poses a difficult commercial problem.

Conventional methods or producing p-n junctions start from a wafer about 30 mils in thickness, which are mechanically ground to about 20 mils. The resulting wafer is equilibrated with a metal-rich source (in a controlled environment) until a 10 micron deep junction is obtained. The top n equilibrated layer is selectively etched away by well known electroetching means to provide a shallow junction, hopefully as thin as 0.5 microns. The grinding operation causes damage to the crystal lattice of the soft alloy and electroetching, also known as "back etching" requires careful control of all conditions in order to produce the desired junction depth. In addition, the prior art depends on forming the top layer by equilibrating it with the vapor state.

BRIEF DESCRIPTION OF THE INVENTION

The invention may be regarded as a method of making wafers with undamaged clean surfaces for use on diffused junction photo diodes, by first forming a boule of single crystal $Pb_{1-x}$SnaxTe, slicing the boule into disc-shaped wafers about 40 – 50 mils thick, mechanically polishing the surface of said wafers, electrolytically polishing said surfaces, and then annealing the same.

DETAILED DESCRIPTION

An exemplary embodiment of the invention involves the surface preparation of $Pb_{1-x}Sn_xTe$ junctions for infrared detector fabrication. Starting with a pre-alloyed single crystal boule approximately 3 inches long and 1 inch in diameter, the first step is to slice therefrom thin wafers of a thickness of 40 to 50 mils. The boule may be grown by the Bridgman process. The wafer slicing operation is done with a conventional wire saw operating on the principle of a band saw with a fine abrasive slurry aiding the cutting operation. It has been found satisfactory to use a 5 mil wire, with a slurry of silicon carbide abrasive continuously directed at the area of the cut. Preferably, the boule is mounted so that it may move evenly and continuously in an arc towards the running wire with the movement mechanically controlled in order to avoid excessive saw damage.

Step 2 involves mechanically polishing the flat surfaces of the wafers to remove saw damage and to achieve a specific thickness which may be conveniently selected as 30 mils. This may be accomplished by mounting the wafers on a Buehler automatic polisher and polishing with PAW paper and 15 micron alumina. This step also flattens the wafers and tends to cause the surfaces to be more planar.

In Step 3, the wafers are further reduced in thickness to 20 to 25 mils using Norr's electroetch procedure, as described in Volume 109 of the Journal of the Electrochemical Society, page 433 (1962). Contrasted with conventional methods, this involves a relatively mild treatment, which removes all mechanical surface damage from the wafers and simultaneously exposes the true crystal lattice structure therein.

At this point it is desirable to assess the condition of the surface to determine if the electroetching step has proceeded too far or not far enough. This is accomplished by the use of Laue back-reflection x-ray equipment and visual plus photographed microscopic examination. The x-ray equipment is of the type well known in the art by which an x-ray film of the surface is produced for examination. If the film shows the appropriate molecular spacing, then the precise electroetching treatment carried on can be repeated for subsequently treated wafers with the conviction that the same amount of material removal will be accomplished per unit of time. The procedure may be regarded as electro polishing.

Step 4 is the annealing step, which is required to reduce Hall carrier concentration. This is accomplished by sealing the wafers in an ampoule free from contamination under temperature and pressure conditions which permit annealing without deleterious vaporization.

Having thus described my invention, I claim:

1. The method of making lead-tin-telluride wafers from infrared responsive diodes comprising the steps of first alloying $Pb_{1-x}$SnaxTe into a boule, slicing the same into disc-shaped wafers, mechanically polishing the surfaces thereof, electrolytically polishing said surfaces and finally annealing said wafers.

2. The method of claim 1 in which the slicing is accomplished with a wire saw using 5 mil wire with a slurry of silicon carbide to produce wafers having a thickness of 40 to 50 mils.

3. The method of claim 2 in which the mechanical polishing is automatically accomplished with particles of aluminum oxide of the order of 15 mils in size to reduce the thickness of the wafers to 30 mils.

4. The method of claim 3 in which the wafers are further reduced in thickness to 20 to 25 mils by electroetching.

5. The method of claim 4 in which the completed wafers are inspected by Laue back reflection x-ray and microscopic examination.

6. The method of claim 4 in which the completed wafers are annealed at elevated temperatures in an inert atmosphere.

* * * * *